United States Patent
Tsai et al.

(10) Patent No.: US 10,115,597 B2
(45) Date of Patent: *Oct. 30, 2018

(54) SELF-ALIGNED DUAL-METAL SILICIDE AND GERMANIDE FORMATION

(71) Applicant: Taiwan Semiconductor Manufacturing Company, Ltd., Hsin-Chu (TW)

(72) Inventors: Chun Hsiung Tsai, Xinpu Township (TW); Chi-Yuan Shih, Zhubei (TW); Gin-Chen Huang, New Taipei (TW); Clement Hsingjen Wann, Carmel, NY (US); Li-Chi Yu, Jhubei (TW); Chin-Hsiang Lin, Hsin-Chu (TW); Ling-Yen Yeh, Hsin-Chu (TW); Meng-Chun Chang, Taipei (TW); Neng-Kuo Chen, Hsin-Chu (TW); Sey-Ping Sun, Hsin-Chu (TW); Ta-Chun Ma, New Taipei (TW); Yen-Chun Huang, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/419,943

(22) Filed: Jan. 30, 2017

(65) Prior Publication Data

US 2017/0140942 A1    May 18, 2017

Related U.S. Application Data

(60) Continuation of application No. 14/968,652, filed on Dec. 14, 2015, now Pat. No. 9,559,182, which is a
(Continued)

(51) Int. Cl.
*H01L 21/336* (2006.01)
*H01L 21/285* (2006.01)
(Continued)

(52) U.S. Cl.
CPC .... *H01L 21/28518* (2013.01); *H01L 27/0886* (2013.01); *H01L 29/0649* (2013.01);
(Continued)

(58) Field of Classification Search
None
See application file for complete search history.

(56) References Cited

U.S. PATENT DOCUMENTS 9,214,556 B2 * 12/2015 Wann ............... H01L 29/785
2007/0231984 A1 10/2007 Metz et al.
(Continued)

FOREIGN PATENT DOCUMENTS

JP 2006216833 A 8/2006
JP 2009032955 A 2/2009

OTHER PUBLICATIONS

Chan, et al., "Extraction of correct Schottky barrier height of sulfur implanted NiSi/n-Si junctions: Junction doping rather than barrier height lowering," AIP, Applied Physics Letters, 99, May 2011, 3 pps.
(Continued)

*Primary Examiner* — Daniel Whalen
(74) *Attorney, Agent, or Firm* — Slater Matsil, LLP

(57) ABSTRACT

A device having an epitaxial region and dual metal-semiconductor alloy surfaces is provided. The epitaxial region includes an upward facing facet and a downward facing facet. The upward facing facet has a first metal-semiconductor alloy surface and the downward facing facet has a
(Continued)

second metal-semiconductor alloy surface, wherein the first metal-semiconductor alloy is different than the second metal-semiconductor alloy.

20 Claims, 19 Drawing Sheets

Related U.S. Application Data division of application No. 13/963,887, filed on Aug. 9, 2013, now Pat. No. 9,214,556.

(51) Int. Cl.
*H01L 29/78* (2006.01)
*H01L 29/66* (2006.01)
*H01L 27/088* (2006.01)
*H01L 29/161* (2006.01)
*H01L 29/417* (2006.01)
*H01L 29/45* (2006.01)
*H01L 29/06* (2006.01)

(52) U.S. Cl.
CPC ...... *H01L 29/161* (2013.01); *H01L 29/41791* (2013.01); *H01L 29/45* (2013.01); *H01L 29/66545* (2013.01); *H01L 29/66795* (2013.01); *H01L 29/785* (2013.01)

(56) References Cited

U.S. PATENT DOCUMENTS

| | | |
|---|---|---|
| 2008/0299719 A1 | 12/2008 | Tsuchiaki |
| 2009/0026505 A1 | 1/2009 | Okano |
| 2011/0073952 A1* | 3/2011 | Kwok ............... H01L 29/045 257/368 |
| 2013/0187228 A1 | 7/2013 | Xie et al. |
| 2013/0193446 A1 | 8/2013 | Chao et al. |
| 2013/0221447 A1 | 8/2013 | Lee et al. |
| 2014/0203370 A1 | 7/2014 | Maeda et al. |
| 2014/0217517 A1 | 8/2014 | Cai et al. |
| 2015/0162331 A1 | 6/2015 | Kang et al. |

OTHER PUBLICATIONS

Saraswat, "Interconnections: Silicides," EE 311, www.stanford.edu/class/ee311/NOTES/Silicides.pdf; Sep. 2009, 24 pps.
Van Dal, et al. "Demonstration of scaled Ge p-channel FinFETs integrated on Si," TElectroni Devices Meeting, Dec. 2012, 4 pps.

* cited by examiner

SELF-ALIGNED DUAL-METAL SILICIDE AND GERMANIDE FORMATION

This application is a continuation application of U.S. patent application Ser. No. 14/968,652, filed Dec. 14, 2015, entitled "Self-Aligned Dual-Metal Silicide and Germanide Formation," which is a divisional application of U.S. patent application Ser. No. 13/963,887, now U.S. Pat. No. 9,214,556, filed on Aug. 9, 2013, entitled "Self-Aligned Dual-Metal Silicide and Germanide Formation," which applications are incorporated herein by reference in their entirety.

BACKGROUND

Transistors typically include semiconductor regions used to form the source regions and drain regions. Since the contact resistance between metal contact plugs and the semiconductor regions is high, metal silicides are formed on the surfaces of the semiconductor regions such as silicon regions, germanium regions, silicon germanium regions in order to reduce the contact resistance. The contact plugs are formed to contact the silicide regions, and the contact resistance between the contact plugs and the silicide regions are low.

A typical silicidation process includes forming a metal layer on the surfaces of the semiconductor regions, and performing an annealing, so that the metal layer reacts with the semiconductor regions to form the silicide regions. After the reaction, the upper portions of the metal layer may be left un-reacted. An etching step is then performed to remove the un-reacted portions of the metal layer.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided in accordance with various exemplary embodiments. The intermediate stages of forming the FinFET are illustrated. The intermediate stages of forming contacts to the FinFET are also illustrated. The variations of the embodiments are discussed. Throughout the various views and illustrative embodiments, like reference numbers are used to designate like elements.

Figure 1:
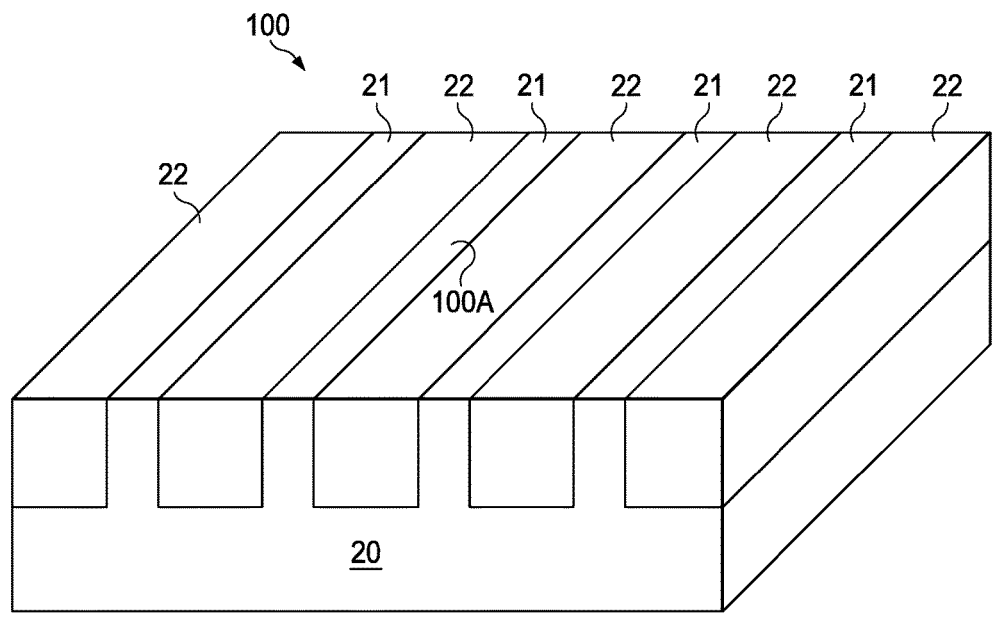
FIGS. 1 through 13 are cross-sectional views and perspective views of intermediate stages in the manufacturing of a Fin Field-Effect Transistor (FinFET) in accordance with some exemplary embodiments.

FIGS. 1 through 13 are cross-sectional views and perspective views of intermediate stages in the manufacturing of a FinFET and the respective contacts in accordance with some exemplary embodiments. FIG. 1 illustrates a perspective view of an initial structure. The initial structure includes wafer 100 including substrate 20. Substrate 20 may be semiconductor substrate, which may further be a silicon substrate, a silicon germanium substrate, or a substrate formed of other semiconductor materials. Substrate 20 may be doped with a p-type or an n-type impurity. Isolation regions such as Shallow Trench Isolation (STI) regions 22 may be formed to extend from a top surface of substrate 20 into substrate 20, wherein the top surface of substrate 20 is a major surface 100A of wafer 100. The portions of substrate 20 between neighboring STI regions 22 are referred to as semiconductor strips 21. The top surfaces of semiconductor strips 21 and the top surfaces of STI regions 22 may be substantially level with each other.

Figure 2:
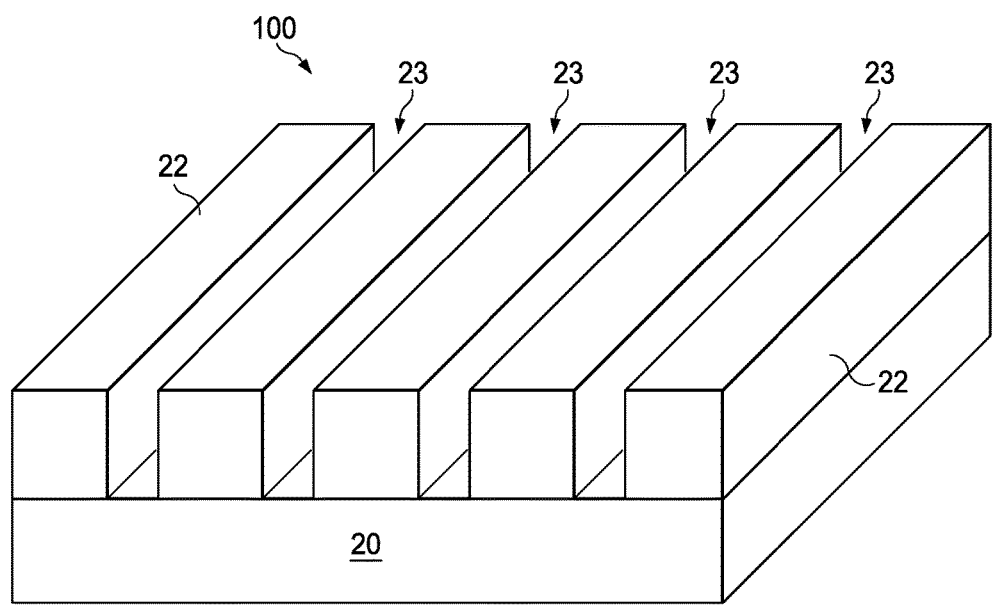
Figure 3:
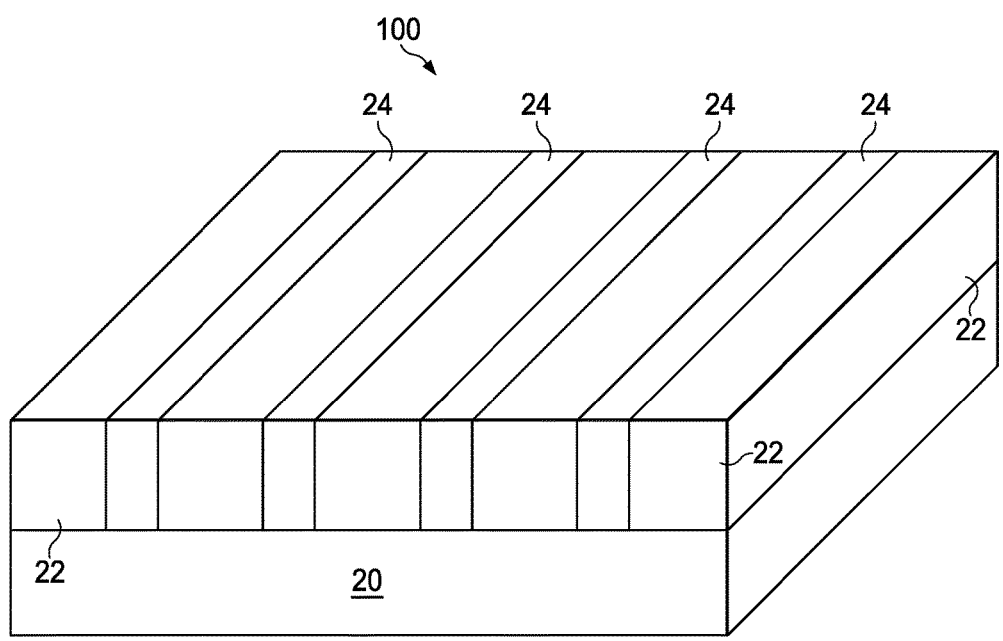

FIGS. 2 and 3 illustrate the replacement of semiconductor strips 21 in FIG. 1 with semiconductor strips 24 in FIG. 3 in accordance with some embodiments. In alternative embodiments, the semiconductor strips 21 in FIG. 1 are not replaced, and hence act as semiconductor strips 24 shown in FIGS. 4 through 13. Referring to FIG. 2, at least the upper portions, or substantially entireties, of semiconductor strips 21 are removed. Accordingly, recesses 23 are formed in STI regions 22. Next, an epitaxy is performed to epitaxially grow semiconductor strips 24 in recesses 23, forming the structure in FIG. 3. Semiconductor strips 24 may have a lattice constant greater than, substantially equal to, or smaller than, the lattice constant of substrate 20. In some embodiments, semiconductor strips 24 comprise silicon germanium, a III-V compound semiconductor, or the like. The silicon germanium in semiconductor strips 24 may have a germanium atomic percentage greater than about 15 percent, or between about 15 percent and about 60 percent. The germanium atomic percentage may also be higher, and semiconductor strips 24 may be substantially pure germanium regions with a germanium atomic percentage higher than, for example, about 95 percent. During the epitaxy of semiconductor strips 24, a p-type impurity such as boron may be in-situ doped with the proceeding or the epitaxy. STI regions 22 are then recessed, so that top portions of semiconductor strips 24 are higher than the top surfaces of STI regions 22 to form semiconductor fins 24'.

Figure 4:
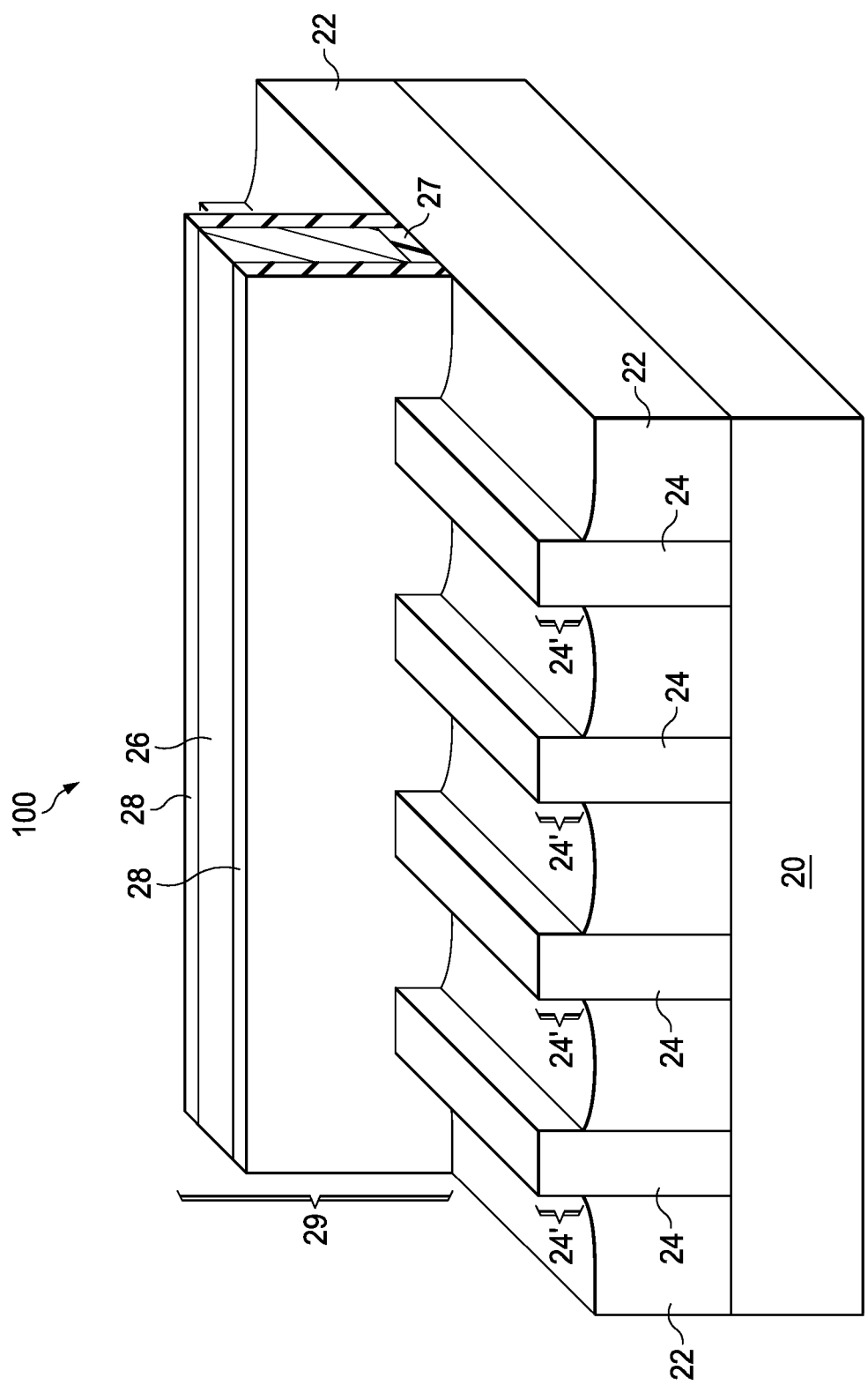

Referring to FIG. 4, gate stack 29 is formed on the top surface and sidewalls of semiconductor fins 24'. Gate stack 29 includes gate dielectric 27, and gate electrode 26 over gate dielectric 27. Gate electrode 26 may be formed, for example, using polysilicon, although other materials such as metal silicides, metal nitrides, or the like, may also be used. Gate stack 29 may also comprise a hard mask layer (not shown) over gate electrode 26, wherein the hard mask layer may comprise silicon nitride, for example. Gate stack 29 crosses over a plurality of semiconductor fins 24' and/or STI regions 22. Gate stack 29 may also have a lengthwise direction substantially perpendicular to the lengthwise direction of semiconductor fins 24'. In some embodiments, gate stack 29 forms the gate stack of the resulting FinFET. In alternative embodiments, gate stack 29 is a dummy gate stack, and will be replaced by a replacement gate in a subsequent step.

Next, as also shown in FIG. 4, gate spacers 28 are formed on the sidewalls of gate stack 29. In some embodiments, gate spacers 28 comprise silicon oxide, silicon nitride, or the like, and may have a multi-layer structure.

Figure 5:
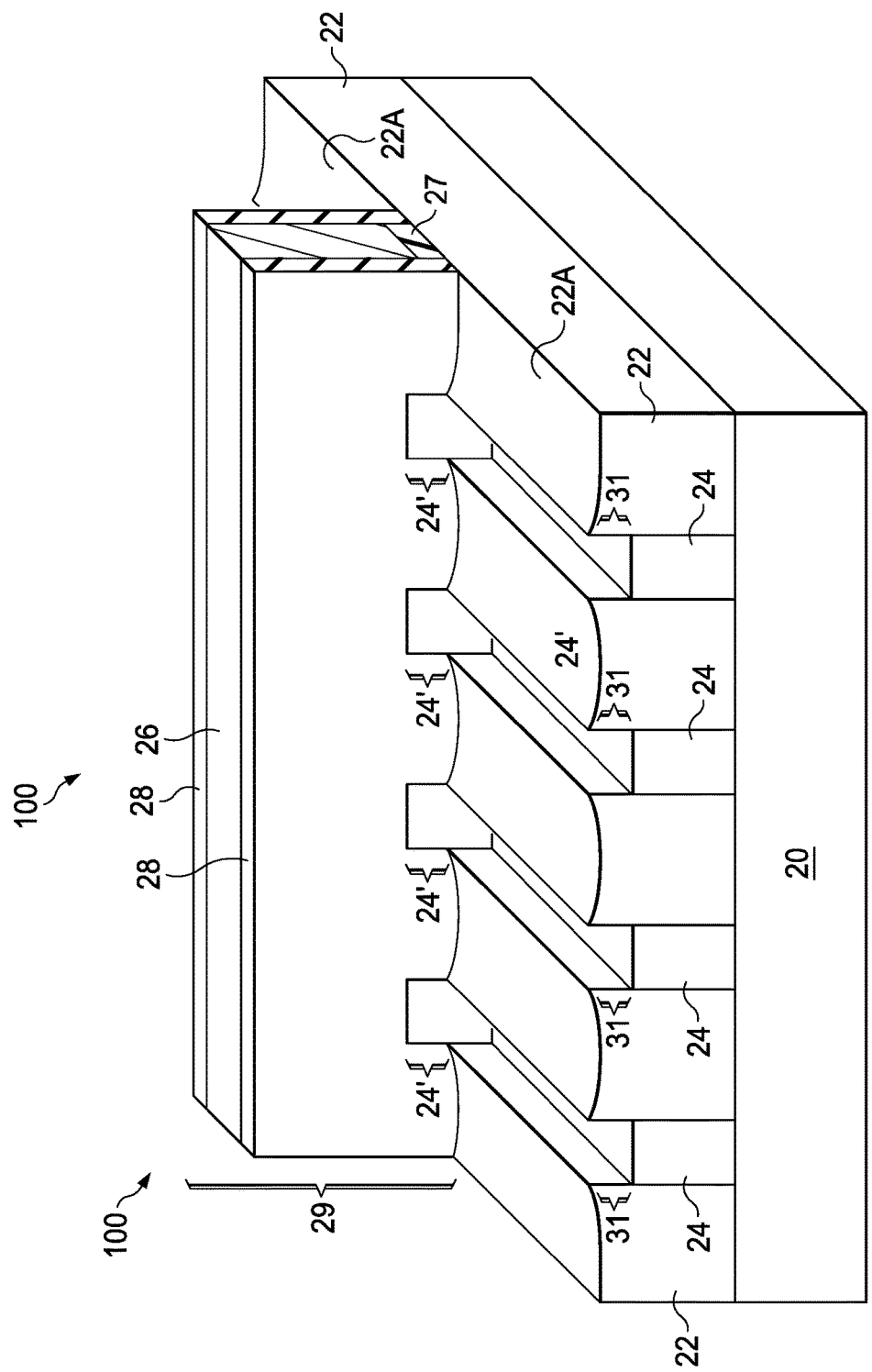
Figure 6:
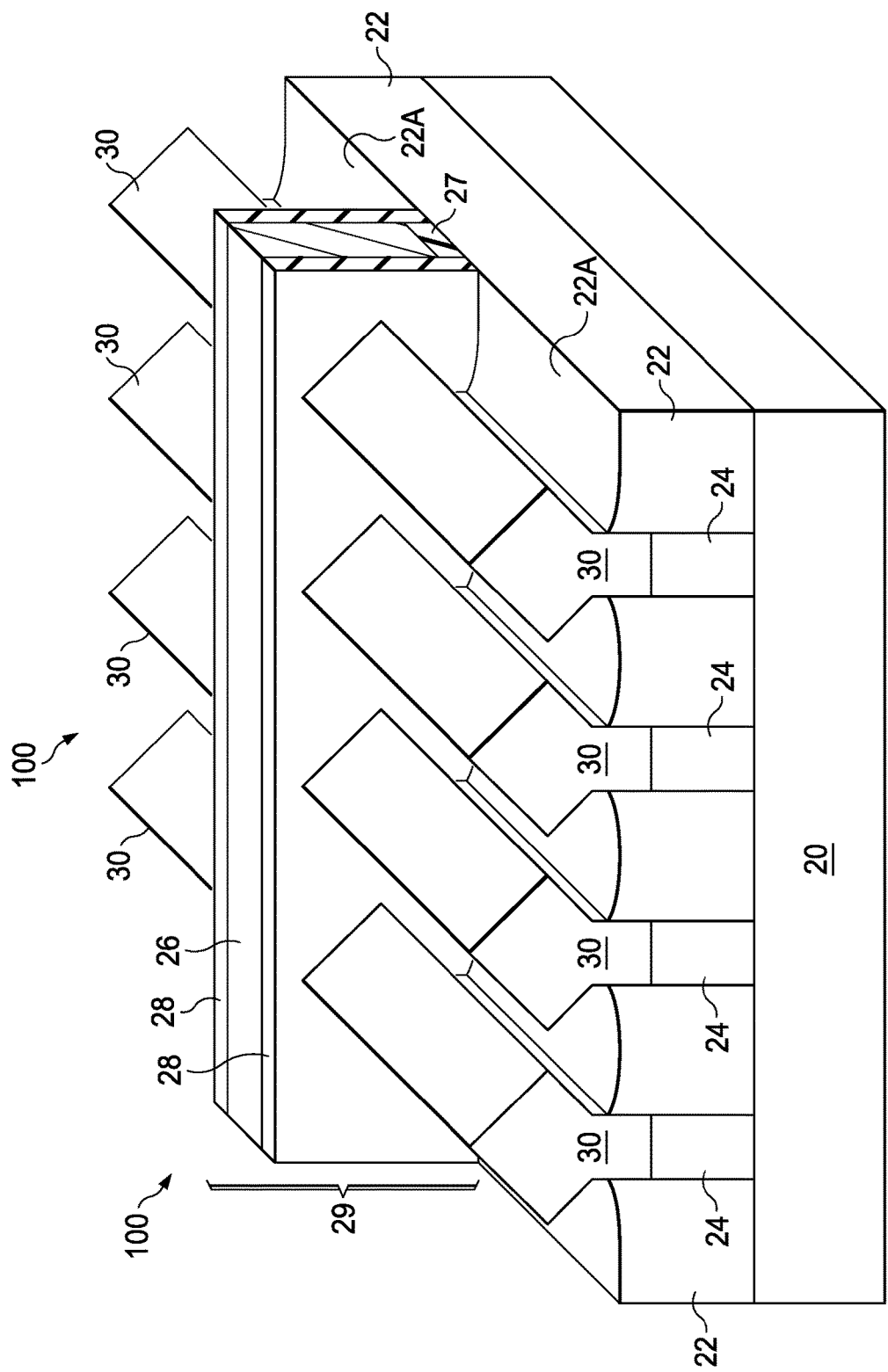

Referring to FIG. 5, an etching step is performed to etch portions of semiconductor fins 24' that are not covered by gate stack 29 and gate spacers 28. The resulting top surfaces 24A of the recessed semiconductor 24 may thus be substantially level with or lower than the top surfaces 22A of STI regions 22. Recesses 31 are accordingly formed between STI regions 22. Recesses 31 are located on opposite sides of gate stack 29. Next, as shown in FIG. 6, epitaxy regions 30 are formed by selectively growing a semiconductor material in recesses 31. In some exemplary embodiments, epitaxy regions 30 comprise silicon germanium. Alternatively, epitaxy regions 30 are formed of pure or substantially pure germanium, for example, with a germanium atomic percentage greater than about 95 percent. After recesses 31 are filled with epitaxy regions 30, the further epitaxial growth of epitaxy regions 30 causes epitaxy regions 30 to expand horizontally, and facets start to form. Furthermore, some of top surfaces 22A of STI regions 22 are underlying and aligned to portions of epitaxy regions 30 due to the lateral growth of epitaxy regions 30.

After the epitaxy step, epitaxy regions 30 may be implanted to form source and drain regions, which are also denoted using reference numeral 30. Source and drain regions 30 are on opposite sides of gate stack 29, and may be overlying and overlapping portions of surfaces 22A of STI regions 22.

Figure 7:
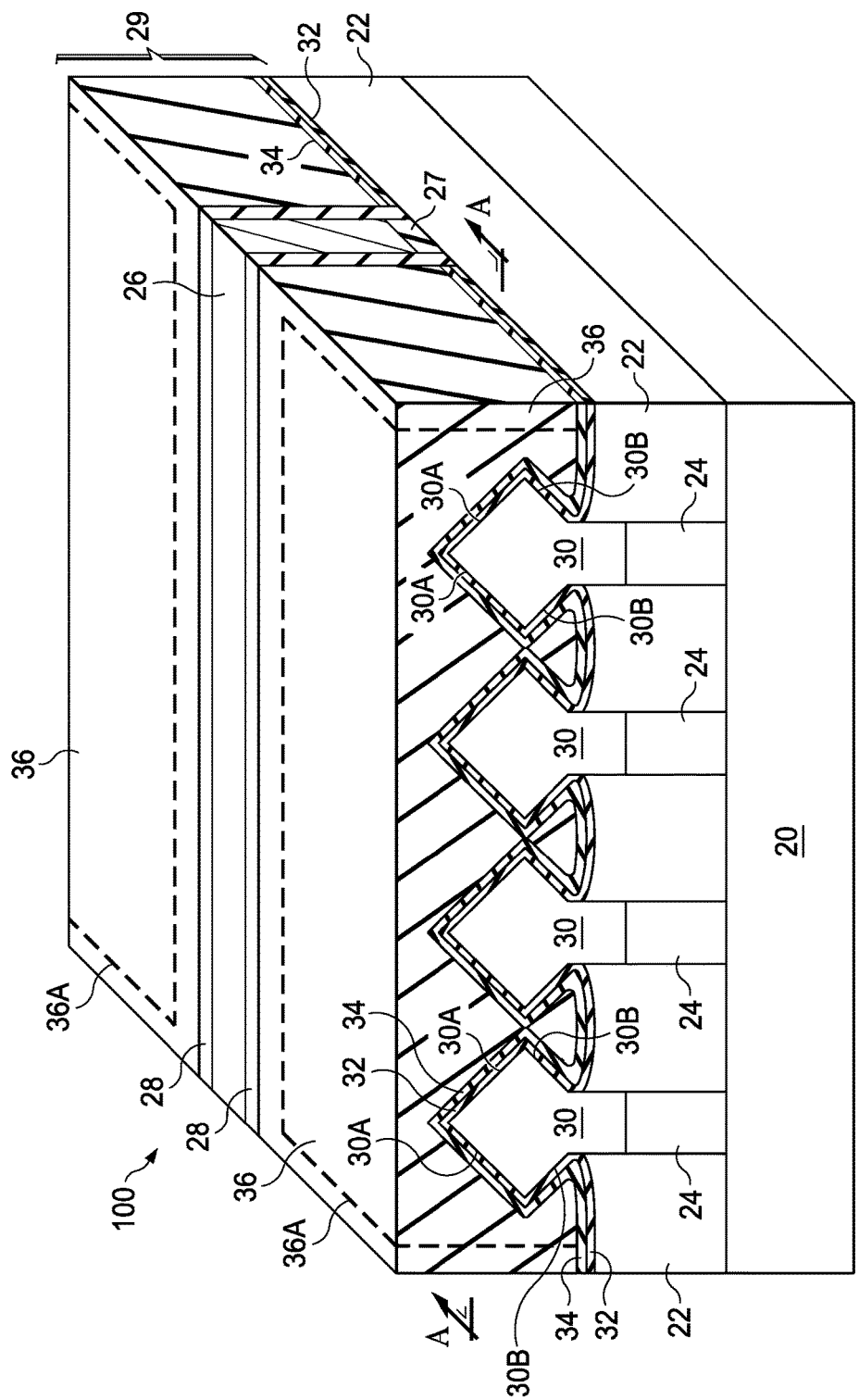

FIG. 7 illustrates a perspective view of the structure after buffer oxide layer 32, Contact Etch Stop Layer (CESL) 34, and Inter-Layer Dielectric (ILD) 36 are formed. In some embodiments, buffer oxide layer 32 comprises silicon oxide, and CESL 34 comprises silicon nitride, silicon carbonitride, or the like. Buffer oxide layer 32 and CESL 34 may be formed using Atomic Layer Deposition (ALD), for example. ILD 36 may comprise Flowable oxide formed using, for example Flowable Chemical Vapor Deposition (FCVD). A Chemical Mechanical Polish (CMP) may be performed to level the top surfaces of ILD 36, gate stack 29, and gate spacers 28 with each other.

Figure 8:
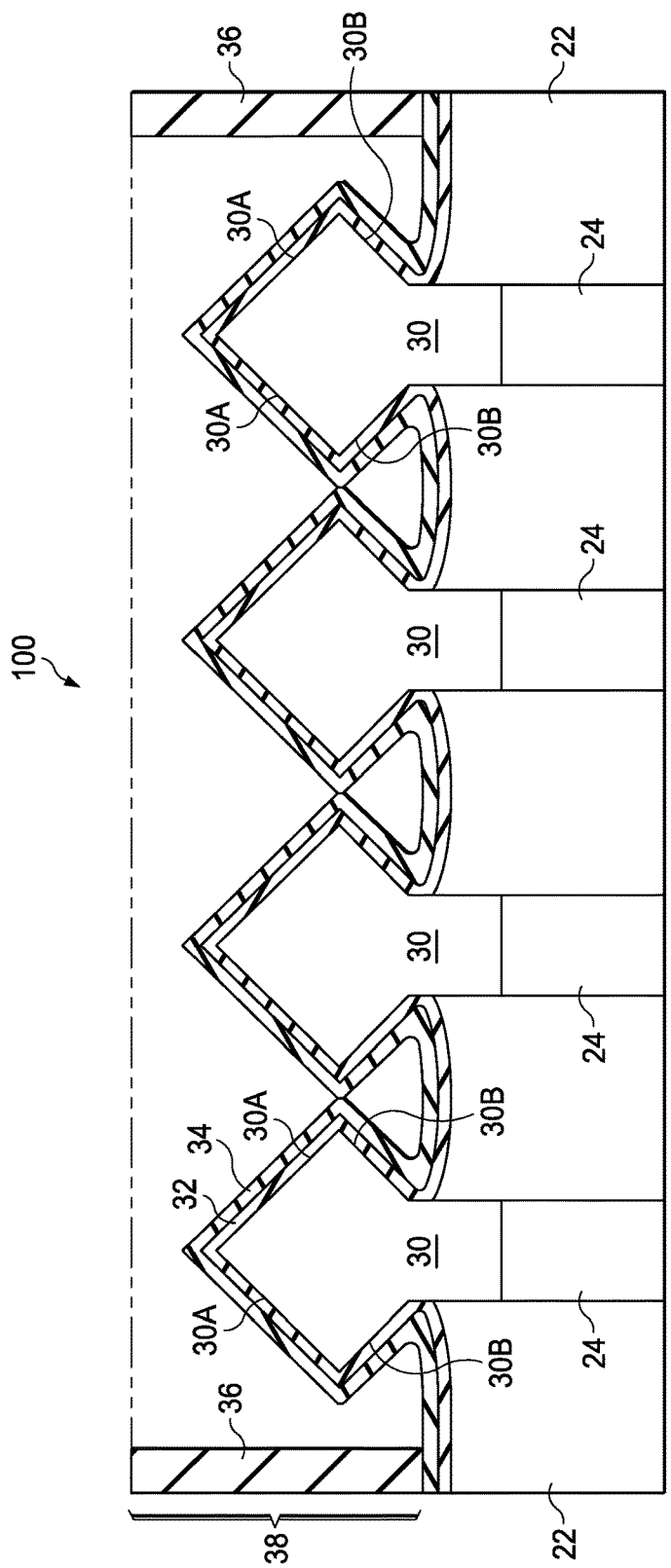

Next, the portions 36A of ILD 36 are removed to form contact openings. One of the contact openings 38 is shown in FIG. 8. FIGS. 8 through 13 are cross-sectional views obtained from the same vertical plane containing line A-A in FIG. 7. As shown in FIG. 8, CESL 34 is exposed to contact openings 38.

Referring to FIG. 8, contact opening 38 is located in ILD 36. Source and drain regions 30 include a plurality of spade-shaped epitaxy regions separated from each other. Epitaxy regions 30 have facets 30A and 30B. Facets 30A are upward facing facets and facets 30B are downward facing facets. Facets 30A and 30B may be on <111> planes of epitaxy regions 30, which may comprise silicon germanium or substantially pure germanium (doped or not doped with boron, for example). Buffer oxide layer 32 is formed on facets 30A and 30B. CESL 34 is formed on buffer oxide layer 32. Both buffer oxide layer 32 and CESL 34 may be conformal layers. Although FIG. 8 illustrates that the portions of the CESL 34 formed on neighboring epitaxy regions 30 are in contact with each other, in alternative embodiments, the portions of the CESL 34 formed on neighboring epitaxy regions 30 are spaced apart from each other.

Figure 9:
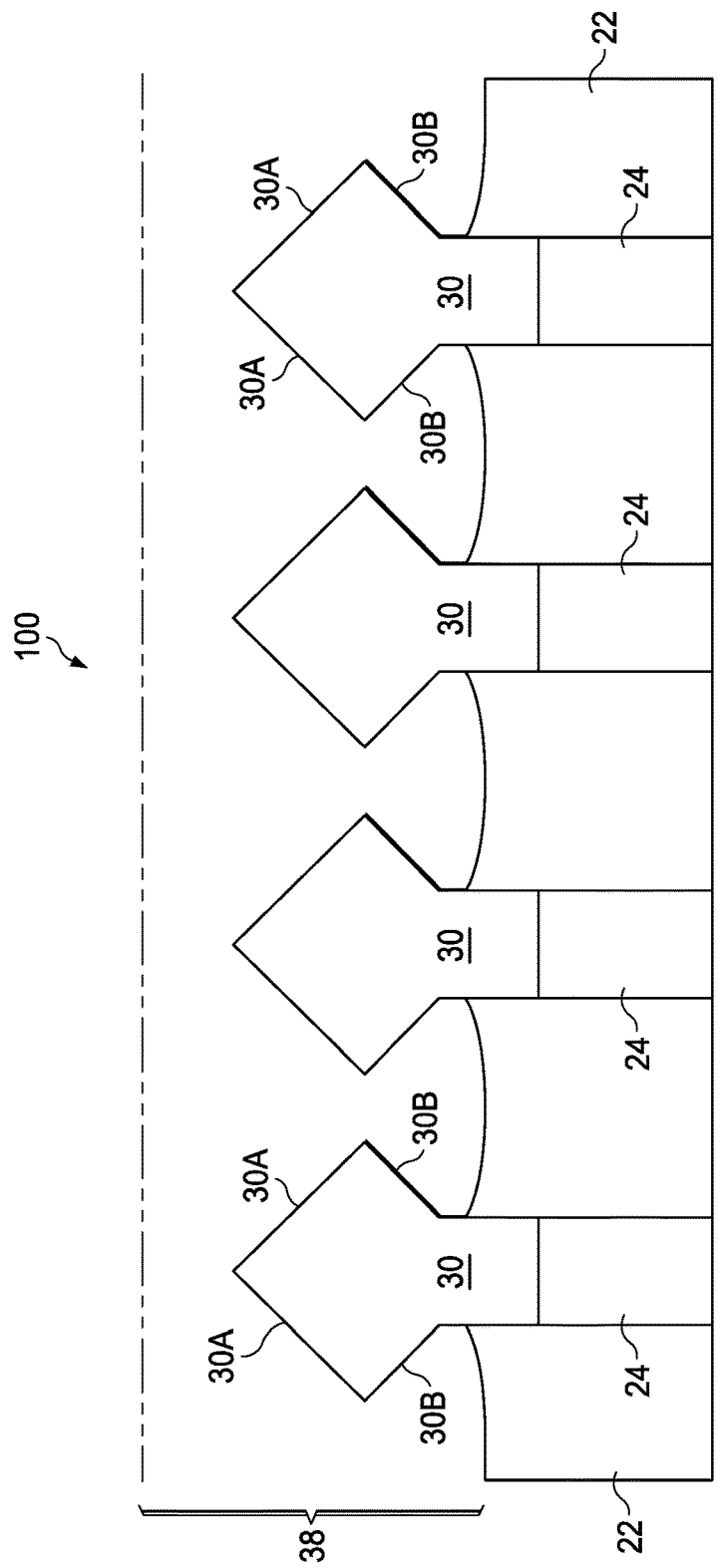

Next, an etching step is performed to remove portions of CESL 34 and buffer oxide layer 32 in contact openings 38. The resulting structure is shown in FIG. 9. In subsequent drawings, ILD 36 and the underlying features covered by ILD 36 are not illustrated, although they still exist. As a result of the etching, facets 30A and 30B are exposed. A pre-clean is performed on the exposed surfaces 30A and 30B. The pre-clean may be performed using, for example, an HF-based gas or a SiCoNi-based gas. The pre-clean may remove the native silicon oxide that is formed as a result of the nature oxidation of the exposed surfaces of epitaxy regions 30.

Figure 10:
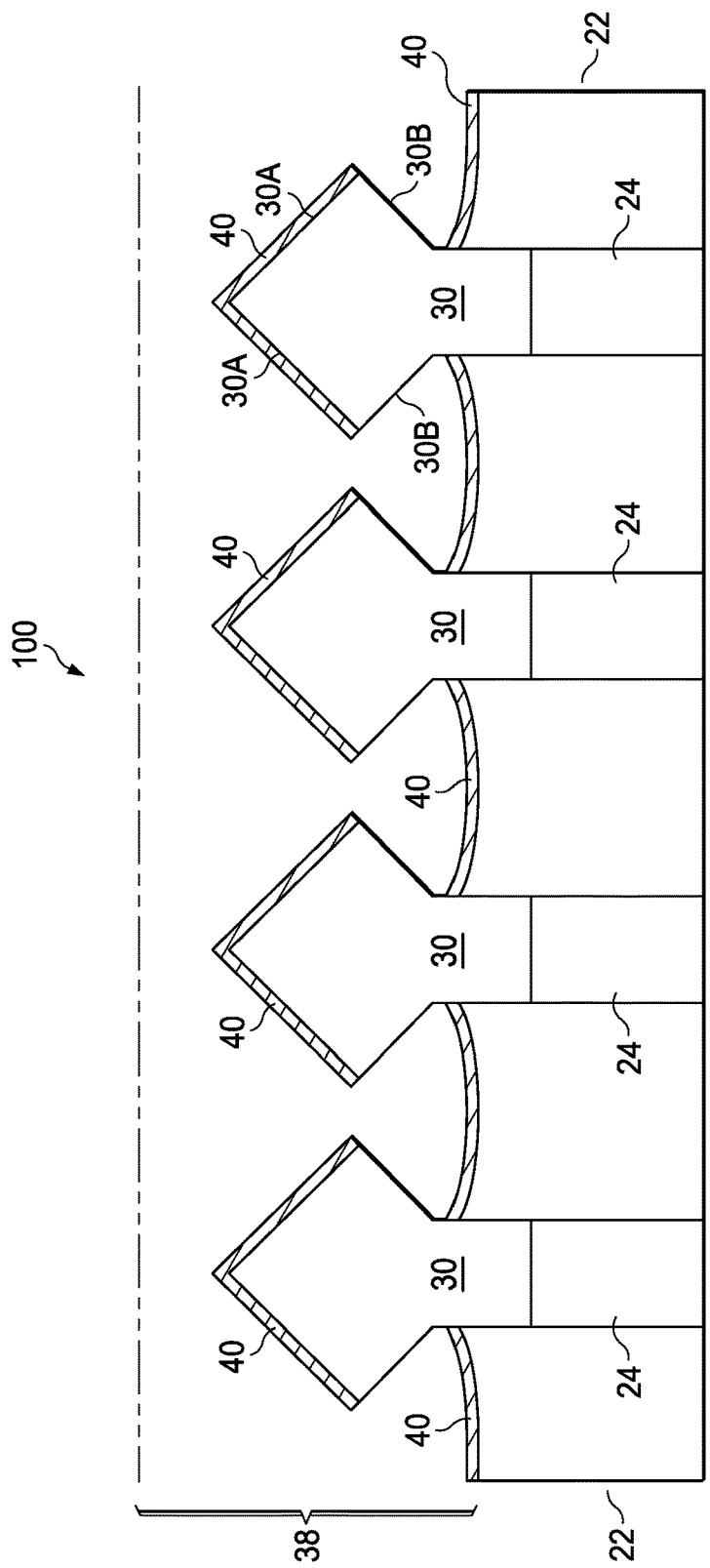

Referring to FIG. 10, metal layer 40 is deposited using a non-conformal deposition method, for example, Physical Vapor Deposition (PVD). Metal layer 40 may be a nickel layer. Alternatively, other metals such as cobalt, platinum, or the like, may also be used. Metal layer 40 is formed as a non-conformal layer, and hence is formed on upward facing facets 30A, and not on downward facing facets 30B. The thickness of metal layer 40 may be in the range between about 10 Å and about 150 Å.

Figure 11:
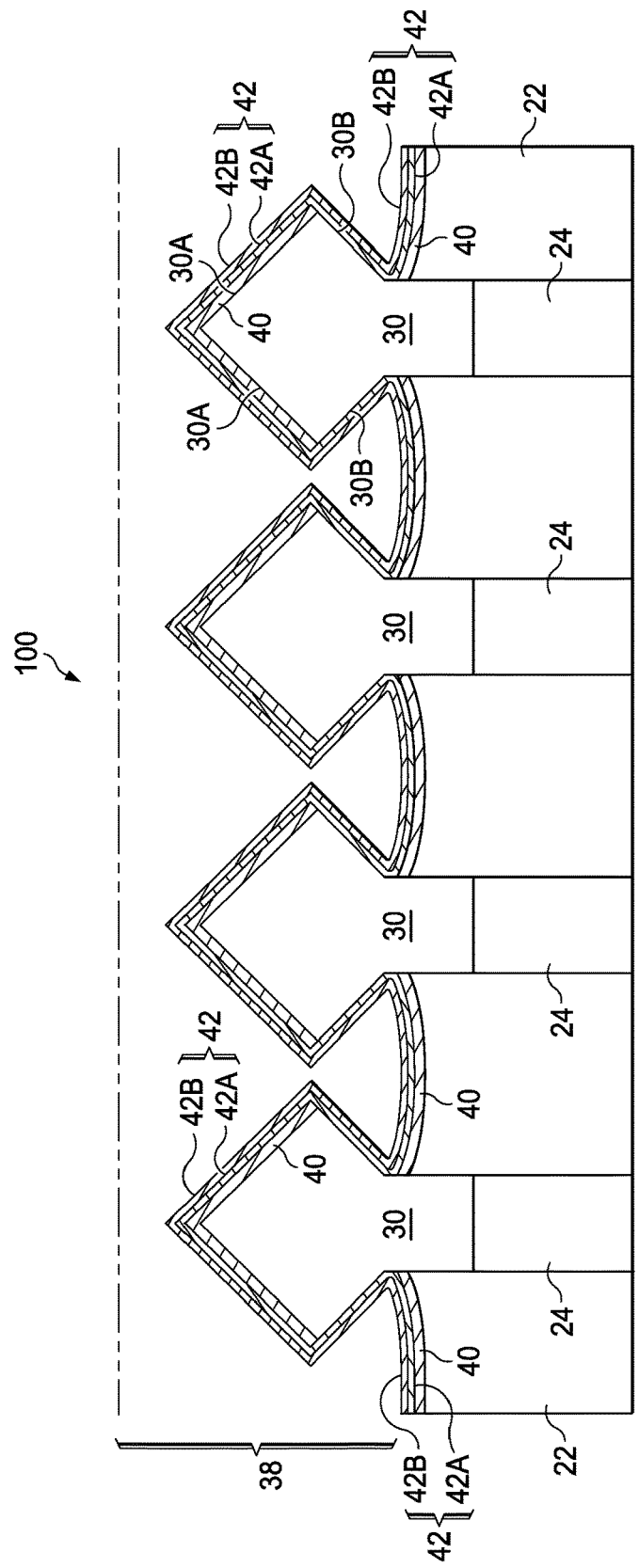

FIG. 11 illustrates the formation of layer 42. In accordance with some embodiments, layer 42 comprises metal layer 42A and metal nitride layer 42B over metal layer 42A. In some exemplary embodiments, metal layer 42A is a titanium layer, and metal nitride layer 42B is a titanium nitride layer. In alternative embodiments, metal layer 42A is a tantalum layer, and metal nitride layer 42B is a tantalum nitride layer. The thickness of metal layer 42A may be between about 20 Å and about 300 Å. The thickness of metal nitride layer 42B may be between about 10 Å and about 200 Å. Layers 42A and 42B may be formed using conformal deposition methods such as ALD. Accordingly, each of layers 42A and 42B includes first portions on upward facing facets 30A, and second portions on downward facing facets 30B. On the upward facing facets 30A, the respective portion of layer 42A contacts metal layer 40. On the downward facing facets 30B, the respective portion of layer 42A contacts facets 30B of epitaxy regions 30.

In accordance with some embodiments, during the period of time between the formation of metal layer 40 and 42, no silicidation process is formed. Accordingly, at the time layer 42 is formed, no metal silicide is formed on facets 30A.

Figure 12:
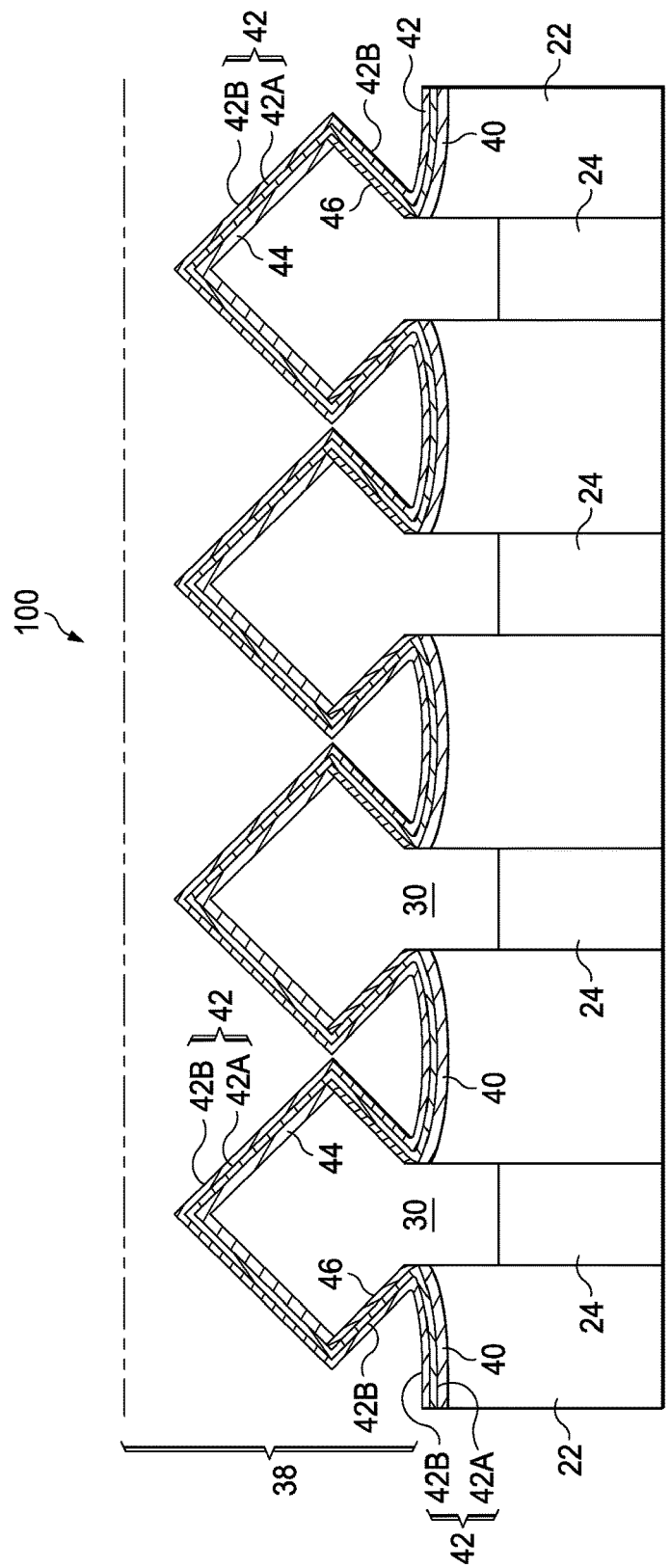

Referring to FIG. 12, an annealing is performed. In accordance with some embodiments, the annealing is performed using, for example, thermal soaking, spike annealing, flash annealing, laser annealing, or the like. The annealing time may be in the range between about 0.1 ms and several minutes. During the annealing, the temperatures of the annealed regions may be in the range between about 300° C. and 1,200° C. As a result of the annealing, on upward facing facets 30A, a metal silicide is formed as a result of the reaction between metal layer 40 and epitaxy regions 30. Silicide layer 44 is thus formed and in contact with upward facing facets 30A. Throughout the description, the terms "metal silicide" and "metal slicide/germanide" are used as generic terms to refer to metal silicides, metal germanides, and metal silicon germanides. Silicide layer 44 may comprise nickel silicide, for example. In some embodiments, metal layer 40 (FIG. 11) is fully consumed, and hence layer 42 (including 42A and 42B) is over and in contact with silicide layer 44. In alternative embodiments, metal layer 40 is partially consumed, and hence over silicide layer 44 resides the remaining metal layer 40, and layer 42 (including 42A and 42B) is over and in contact with the remaining upper portion of metal layer 40.

On downward facing facets 30B, a metal silicide is formed as a result of the reaction of metal layer 42A and epitaxy regions 30, and silicide layer 46 is formed, and is in contact with downward facing facets 30B. Silicide layer 46 may comprise titanium silicide or tantalum silicide, for example. Metal nitride layer 42B remains un-silicided, and is in contact with metal silicide 46. Layer 42 covers the top surfaces of STI regions 22.

Figure 13:
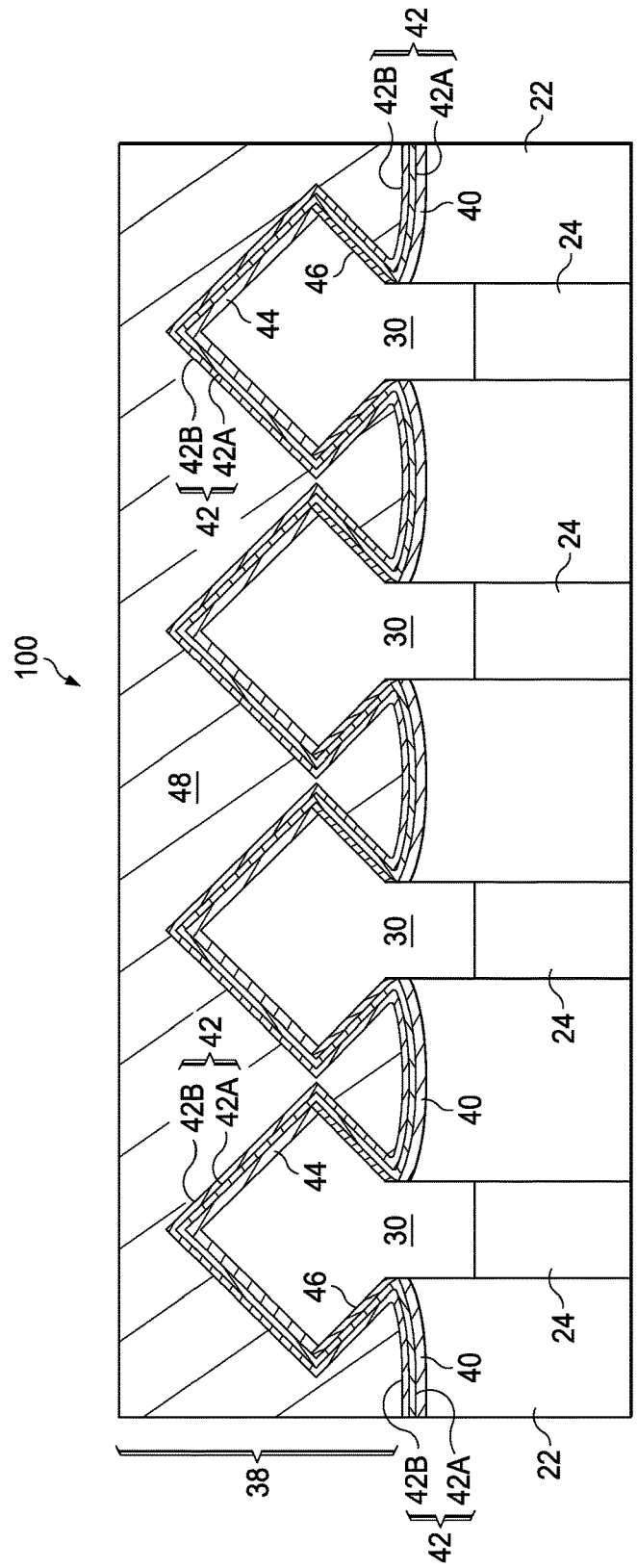

Referring to FIG. 13, the remaining contacting opening 38 (FIG. 12) is filled with a conductive material. After the filling of the conductive material, a Chemical Mechanical Polish (CMP) is performed to remove the excess portion of the conductive material, and the remaining conductive material in opening 38 forms contact plug 48. In some embodiments, contact plug 48 comprises tungsten. In alternative embodiments, contact plug 48 comprises other metal or metal alloys such as aluminum, copper, or the like.

In accordance with the embodiments of the present disclosure, after the silicidation, there is no metal removal step for removing the remaining portions of metal layer 40, if any. Furthermore, epitaxy regions 30 are covered and protected by layer 42B. Therefore, there is no Galvanic corrosion occurring to epitaxy regions 30, which Galvanic corrosion was observed in conventional metal removal step due to the exposure of epitaxy regions to the respective etchant.

FIGS. 14 through 20 illustrate cross-sectional views of intermediate stages in the formation of a FinFET in accordance with alternative embodiments. Unless specified otherwise, the materials and formation methods of the components in these embodiments are essentially the same as the like components, which are denoted by like reference numerals in the embodiments shown in FIGS. 1 through 13. The details regarding the formation process and the materials of the components shown in FIGS. 14 through 20 may thus be found in the discussion of the embodiment shown in FIGS. 1 through 13.

The initial steps of these embodiments are essentially the same as shown in FIGS. 1 through 9. In these embodiments, epitaxy regions 30 comprise pure or substantially pure germanium, for example, with the germanium atomic percentage greater than about 95 percent, or even greater than about 99 percent. A p-type impurity may be doped in epitaxy regions 30 when epitaxy regions 30 are grown. Epitaxy regions 30 may be free from silicon, or may comprise silicon germanium with a silicon percentage smaller than about 5 percent, or smaller than about 1 percent.

Figure 14:
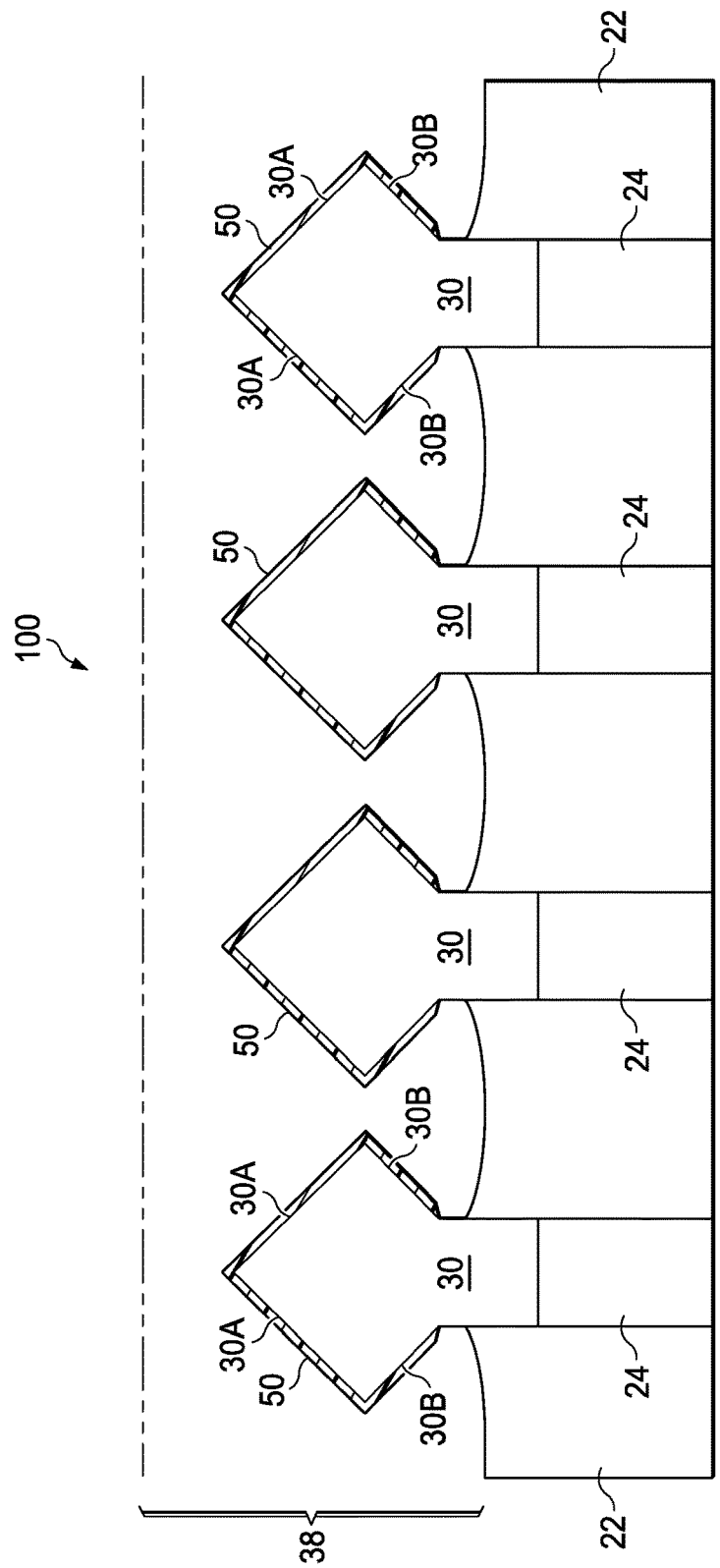
FIGS. 14 through 20 are cross-sectional views and perspective views of intermediate stages in the manufacturing of a FinFET in accordance with alternative embodiments.

Referring to FIG. 14, silicon germanium layer 50 is formed on epitaxy regions 30 through epitaxy. Silicon germanium layer 50 is thus in contact with facets 30A and 30B. In accordance with some embodiments, silicon germanium layer 50 has a silicon atomic percentage greater than about 30 percent, or greater than about 45 percent. Furthermore, the silicon percentage in silicon germanium layer 50 is greater than the silicon percentage in epitaxy regions 30 by at least about 30 percent. For example, if epitaxy regions 30 have zero percent silicon, silicon germanium layer 50 may have 30 percent silicon or more. The thickness of silicon germanium layer 50 may be in the range between about 10 Å and about 200 Å.

Figure 15:
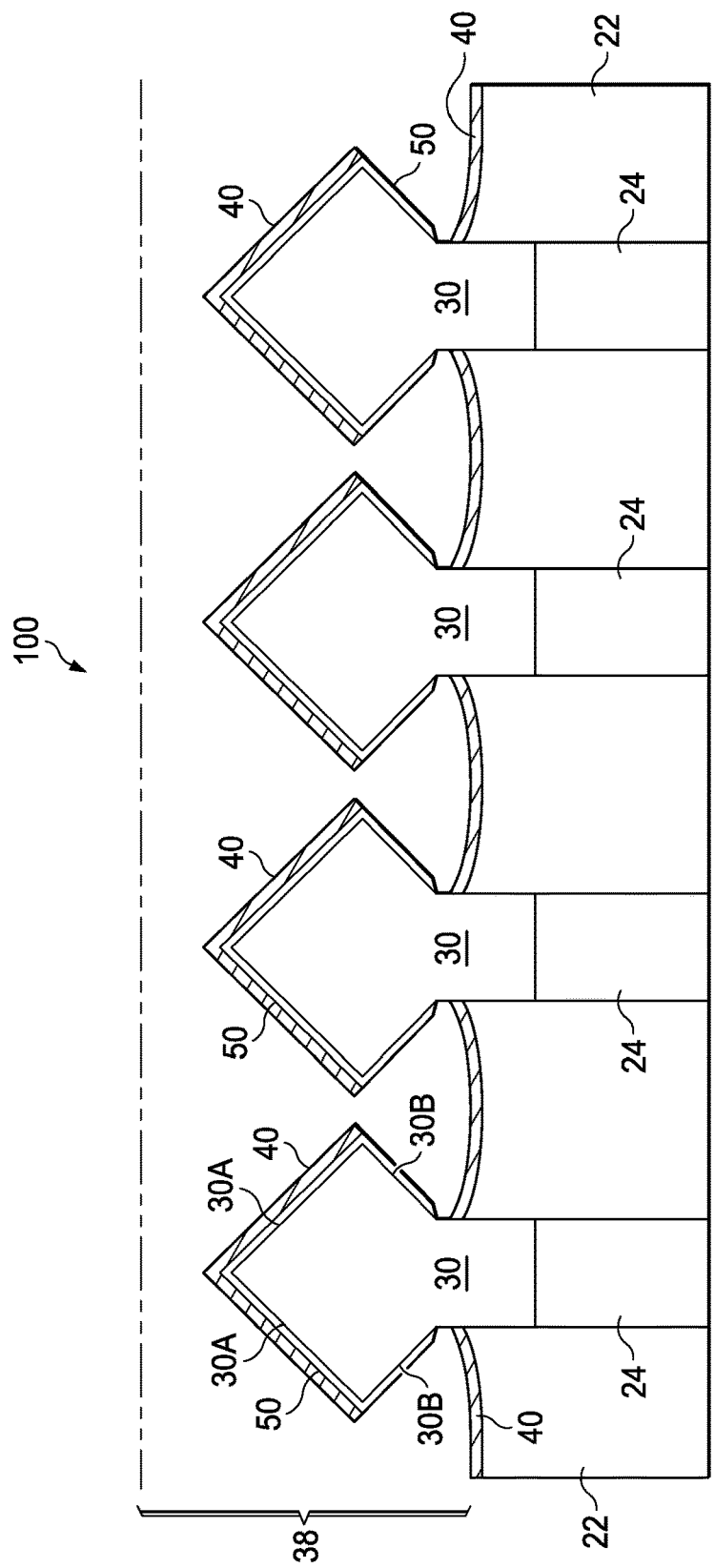
Figure 16:
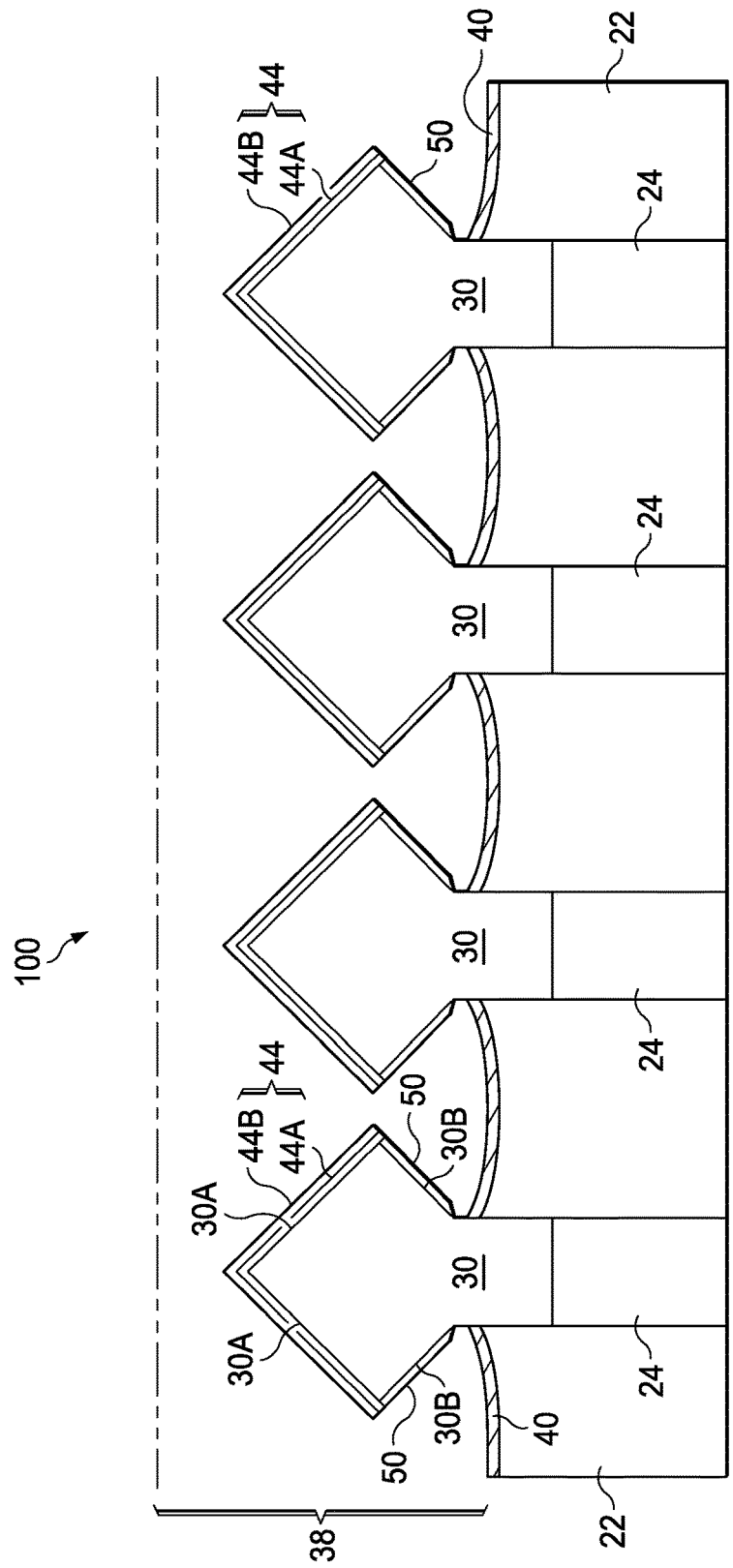

Referring to FIG. 15, metal layer 40 is formed on upward facing facets 30A of epitaxy regions 30 and in contact with silicon germanium layer 50. Metal layer 40 is formed using a non-conformal deposition method, and hence not formed on downward facing facets 30B. Metal layer 40 may be formed using PVD. Next, a first annealing is performed, for example, with a temperature in the range between about 150° C. and about 350° C., and an anneal duration in the range between about 10 seconds and about 120 seconds. The resulting structure is shown in FIG. 16. As a result the annealing, silicide/germanide layer 44 is formed on upward facing facets 30A. When silicon germanium layer 50 (FIG. 15) is thin, silicide layer 44 may include germanide layer 44A (for example, nickel germanide) and silicon germanide layer 44B (for example, nickel silicon germanide) over germanide layer 44A. Although not illustrated, there may be an un-reacted top portion of metal layer 40 remaining over silicide/germanide layer 44. In alternative embodiments (not shown), the top portion of silicon germanium layer 50 is silicided, and the bottom portion of silicon germanium layer 50 remains un-silicided. Accordingly, silicide/germanide layer 44 includes a silicon germanide layer in contact with an un-consumed lower portion of silicon germanium layer 50.

Figure 17:
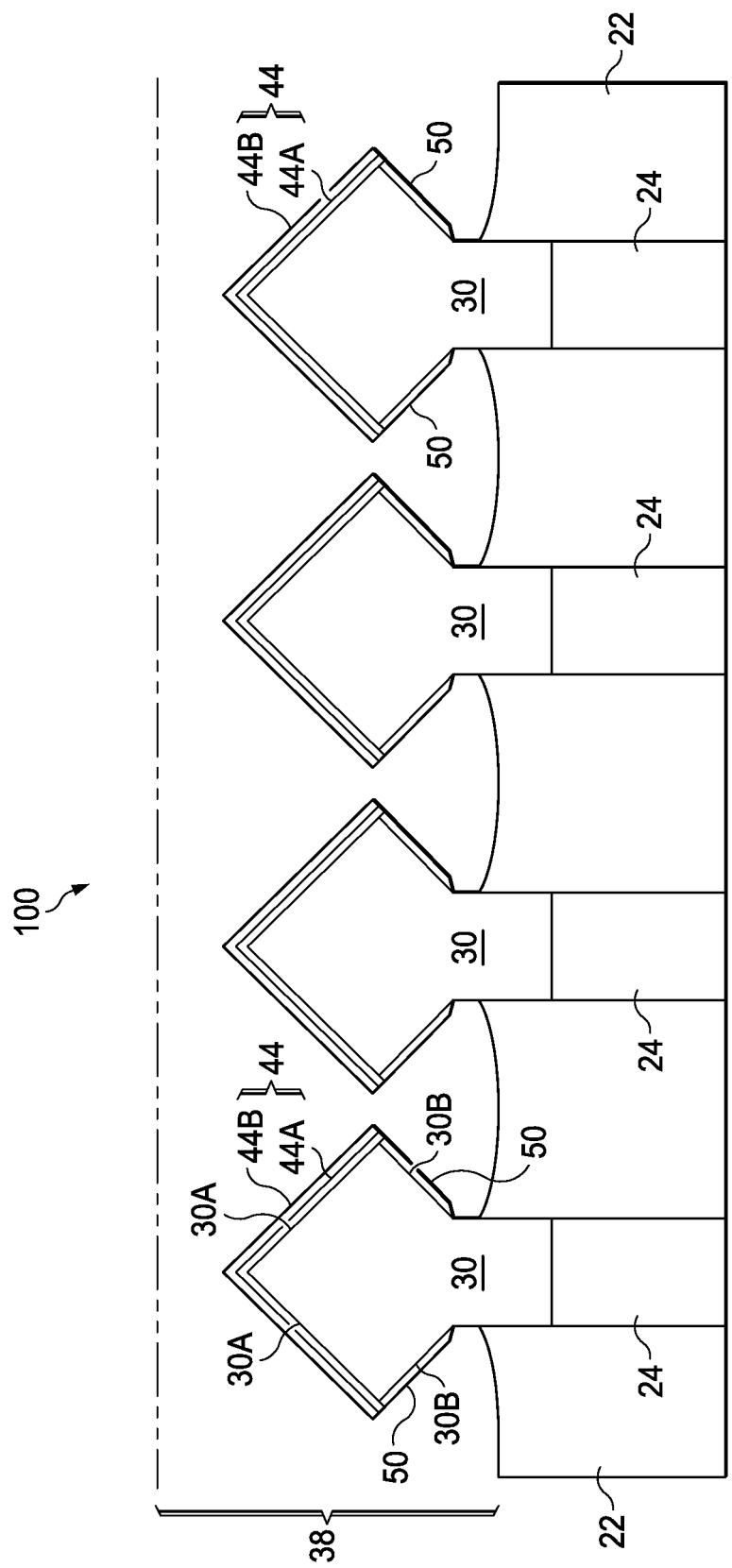

Next, as shown in FIG. 17, the remaining portions of unreacted metal layer 40 are removed using an etchant attacking metal layer 40, but not attacking the resulting silicide/germanide.

Figure 18:
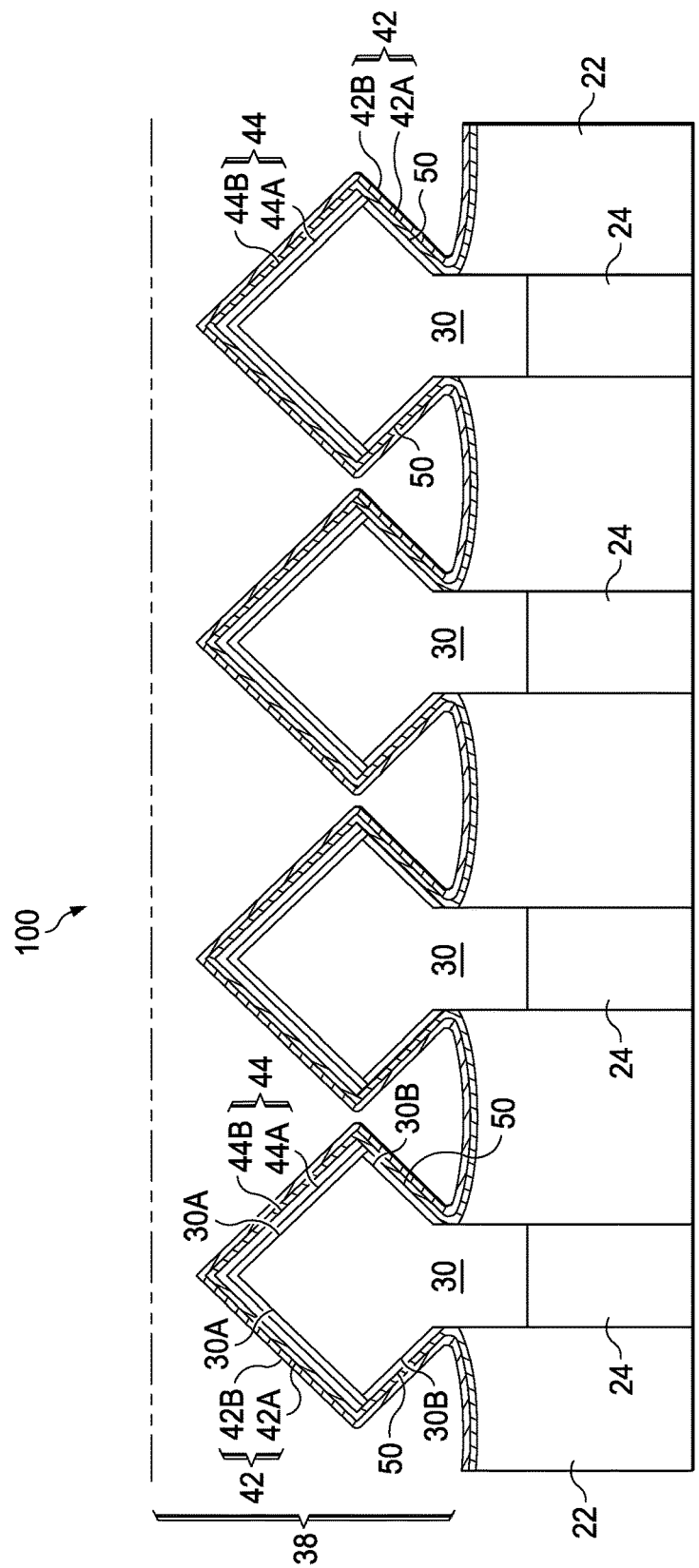
Figure 19:
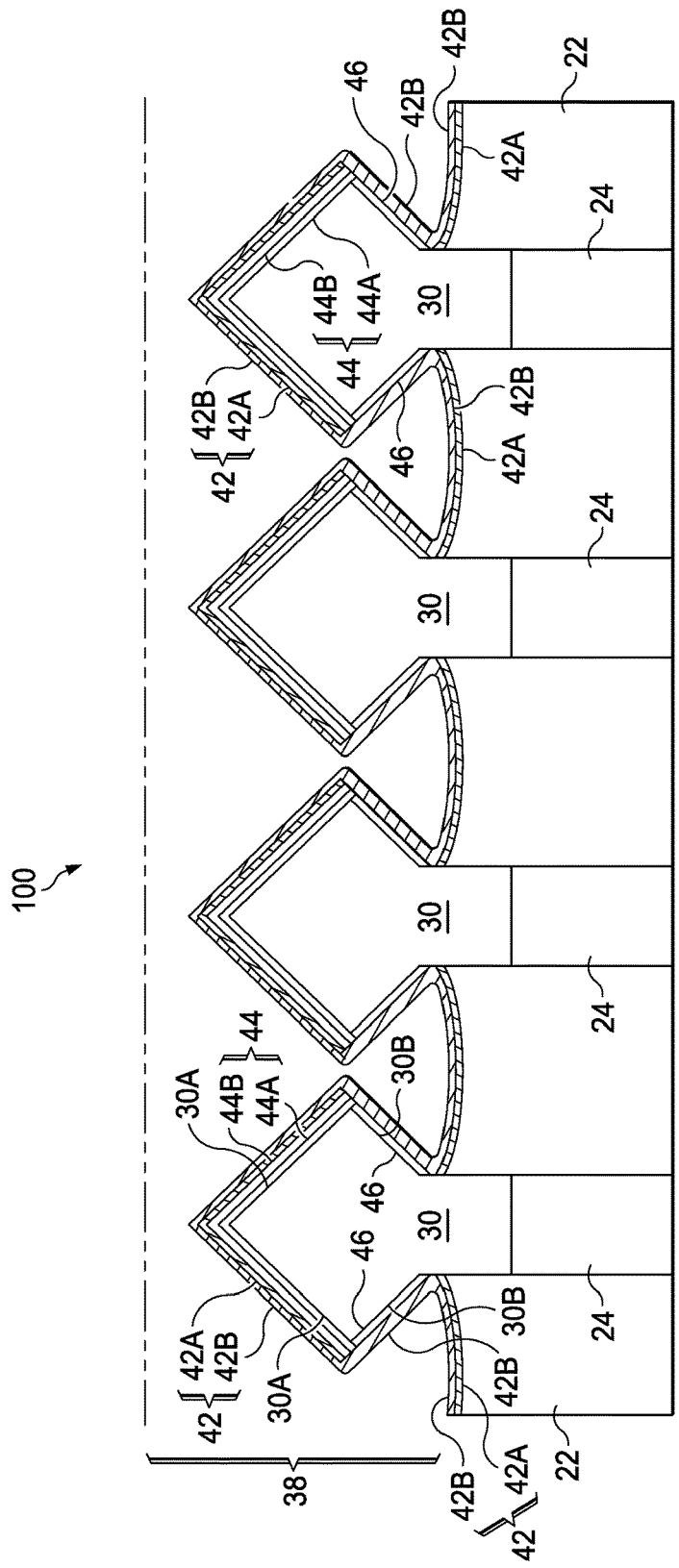

FIG. 18 illustrates the formation of the conformal metal layer 42 (including layers 42A and 42B), which is essentially the same as in the embodiments in FIG. 11. Metal layer 43 is formed using a conformal deposition method such as ALD. The details of metal layer 42 are thus not repeated. Next, a second annealing is performed, for example, with a temperature in the range between about 250° C. and about 450° C., and an anneal duration in the range between about 10 seconds and about 120 seconds. The resulting structure is shown in FIG. 19. The portion of silicon germanium layer 50 (FIG. 18) on downward facing facets 30B reacts with metal layer 42A to form silicon germanide layer 46 on downward facing facets 30B. Metal nitride layer 42B remains to be in contact with silicon germanide layer 46.

Figure 20:
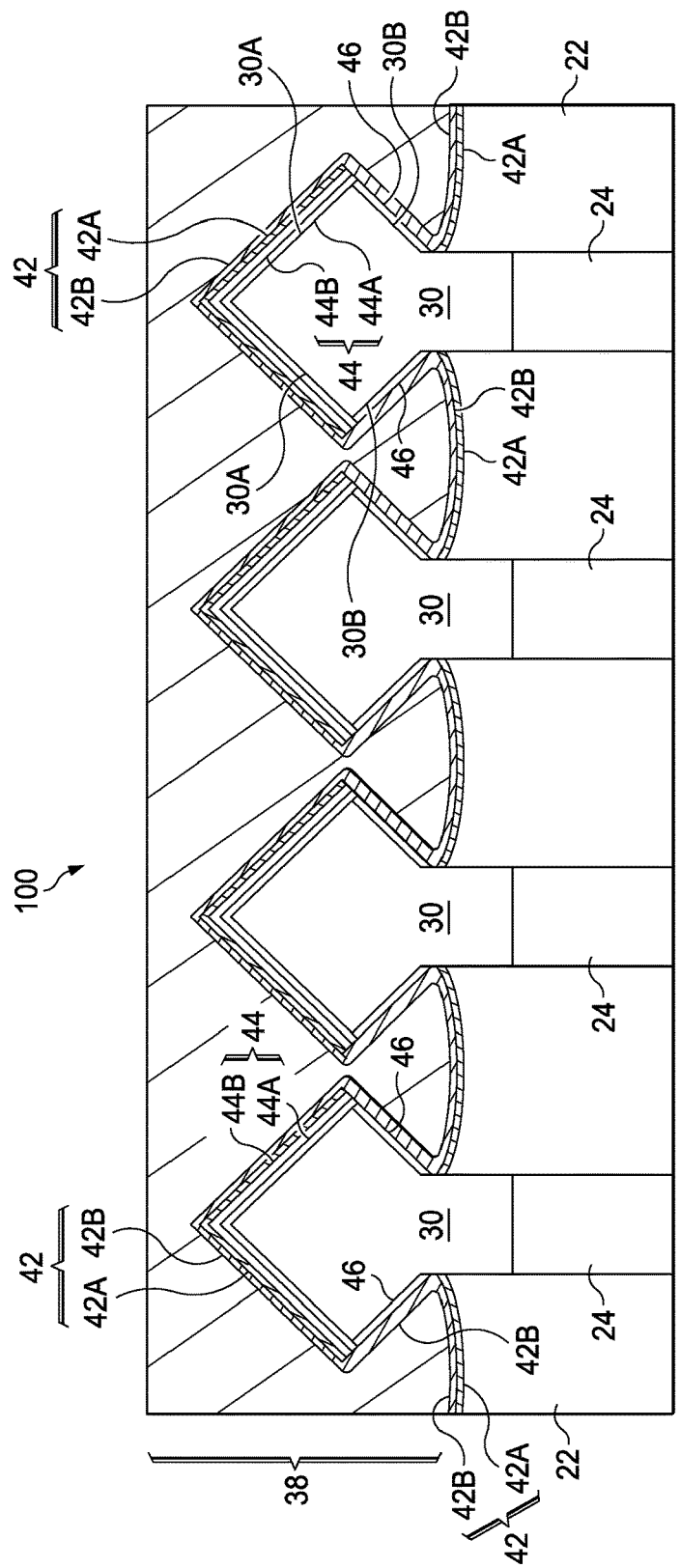

FIG. 20 illustrates the formation of contact plug 48, which fills contact opening 38 in FIG. 19. Contact plug 48 may be formed of the same material, and using the same method, as in the embodiments in FIG. 13. In the resulting structure, contact plug 48 is in contact with layer 42B. On upward facing facets 30A, there is metal silicide/germanide layer 44, metal layer 42A on silicide/germanide layer 44, and metal nitride layer 42B on metal layer 42A. The portion of silicide/germanide layer 44 on upward facing facets 30A may include germanide layer 44A and silicon germanide layer 44B on germanide layer 44A. On downward facing facets 30B, there is metal silicon germanide layer 46 contacting downward facing facets 30B, and metal nitride layer 42B on metal silicon germanide layer 46.

In the embodiments shown in FIGS. 14 through 20, although the remaining un-reacted metal layer 42 is removed in the step shown in FIG. 17. In the respective metal removal step, the downward facing facets 30B are protected by silicon germanium layer 50, which is more resistant to the respective etchant than epitaxy regions 30 having high germanium concentration. Accordingly, the Galvanic corrosion that causes the loss of the exposed epitaxy regions, which is observed in conventional processes, is at least reduced, and may be eliminated.

In accordance with some embodiments, a method includes growing an epitaxy semiconductor region at a major surface of a wafer. The epitaxy semiconductor region has an upward facing facet facing upwardly and a downward facing facet facing downwardly. The method further includes forming a first metal silicide layer contacting the upward facing facet, and forming a second metal silicide layer contacting the downward facing facet. The first metal silicide layer and the second metal silicide layer comprise different metals.

In accordance with other embodiments, a method includes growing an epitaxy semiconductor region at a major surface of a wafer. The epitaxy semiconductor region has an upward facing facet facing upwardly and a downward facing facet facing downwardly. The upward facing facet and the downward facing facet are neither parallel nor perpendicular to the major surface of the wafer. A first metal layer is formed to contact the upward facing facet. A second metal layer is formed. The second metal layer includes a first portion contacting the downward facing facet, and a second portion over and contacting the first metal layer. The first metal layer and the second metal layer comprise different metals. An annealing is performed, wherein the first metal layer reacts with the upward facing facet to form a first metal silicide layer, and simultaneously, the second metal layer reacts with the downward facing facet to form a second metal silicide layer.

In accordance with yet other embodiments, an integrated circuit includes an epitaxy semiconductor region at a major surface of a wafer. The epitaxy semiconductor region has an upward facing facet facing upwardly and a downward facing facet facing downwardly. The upward facing facet and the downward facing facet are neither parallel nor perpendicular to the major surface of the wafer. A first metal silicide layer contacts the upward facing facet. A second metal silicide layer contacts the downward facing facet. The first metal silicide layer and the second metal silicide layer comprise different metals.

In another embodiment, an integrated circuit is provided. The integrated circuit includes an epitaxy semiconductor region over a surface of a wafer, wherein the epitaxy semiconductor region comprising an upward facing facet facing upwardly and a downward facing facet facing downwardly, and wherein the upward facing facet and the downward facing facet are neither parallel nor perpendicular to the major surface of the wafer. A first metal silicide layer contacts the upward facing facet, and a second metal silicide layer contacting the downward facing facet, wherein the first metal silicide layer and the second metal silicide layer comprise different metals.

In yet another embodiment, an integrated circuit is provided. The integrated circuit includes a semiconductor substrate, a fin extending from the semiconductor substrate, the fin having an epitaxy semiconductor region, the epitaxy semiconductor region having an upward facing facet and a downward facing facet, and a dielectric layer extending along opposing sidewalls of the fin. A first metal-semiconductor alloy extends along the upward facing facet, and a second metal-semiconductor alloy extends along the downward facing facet, the first metal-semiconductor alloy being a different alloy than the second metal-semiconductor alloy.

In yet still another embodiment, an integrated circuit is provided. The integrated circuit includes a semiconductor substrate having a first fin and a second fin extending therefrom, each of the first fin and the second fin having an upward facing facet and a downward facing facet, a first metal-semiconductor alloy along the upward facing facet of the first fin and the second fin, and a second metal-semiconductor alloy along the downward facing facet of the first fin and the second fin, the first metal-semiconductor alloy being a different alloy than the second metal-semiconductor alloy. A conductive contact electrically couples the first fin to the second fin.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    growing a first epitaxy semiconductor region on a wafer, wherein the first epitaxy semiconductor region comprises an upward facing facet facing upwardly and a downward facing facet facing downwardly;
    forming a second epitaxy semiconductor region on the upward facing facet and the downward facing facet;
    forming a first metal layer over the second epitaxy semiconductor region on the upward facing facet; and
    performing a first anneal, wherein the first metal layer reacts with the second epitaxy semiconductor region to form a first metal silicide/germanide layer, the downward facing facet being free of the first metal silicide/germanide layer.

2. The method of claim 1, further comprising:
    forming a second metal layer over the first metal silicide/germanide layer on the upward facing facet and over the second epitaxy semiconductor region on the downward facing facet; and
    performing a second anneal, wherein the second metal layer reacts with the first epitaxy semiconductor region to form a second metal silicide/germanide layer, the first metal silicide/germanide layer being a different material than the second metal silicide/germanide layer.

3. The method of claim 2, prior to performing the second anneal, forming a nitride layer over the second metal layer on the upward facing facet and the downward facing facet.

4. The method of claim 3, wherein the nitride layer is a nitride of a material of the second metal layer.

5. The method of claim 3, further comprising forming a contact plug, the contact plug contacting the nitride layer on the upward facing facet and the downward facing facet.

6. The method of claim 1, further comprising forming isolation regions on the wafer, the isolation regions being on opposing sides of the first epitaxy semiconductor region, the isolation regions having a concave upper surface.

7. The method of claim 1, wherein after performing the first anneal, a portion of the second epitaxy semiconductor region remains on the upward facing facet.

8. A method comprising:
    growing a first epitaxy semiconductor region on a wafer, wherein the first epitaxy semiconductor region comprises an upward facing facet facing upwardly and a downward facing facet facing downwardly;
    forming a second epitaxy semiconductor region on the upward facing facet and the downward facing facet;
    forming a first metal silicide/germanide layer over the upward facing facet; and
    forming a second metal silicide/germanide layer on the downward facing facet, wherein the first metal silicide/germanide layer and the second metal silicide/germanide layer comprise different metals.

9. The method of claim 8, wherein forming the first metal silicide/germanide layer comprises:
    forming a first metal layer over the second epitaxy semiconductor region on the upward facing facet, the downward facing facet being free of the first metal layer;
    annealing to cause the first metal layer to react with the second epitaxy semiconductor region; and
    removing unreacted portions of the first metal layer.

10. The method of claim 9, wherein the first metal silicide/germanide layer comprises:
   a first germanide sublayer; and
   a first silicon germanide sublayer.

11. The method of claim 10, wherein forming the second metal silicide/germanide layer comprises:
   forming a second metal layer over the first metal silicide/germanide layer on the upward facing facet and over the second epitaxy semiconductor region on the downward facing facet;
   forming a nitride layer over the second metal layer on the upward facing facet and on the downward facing facet; and
   annealing to cause the second metal layer to react with the second epitaxy semiconductor region on the downward facing facet.

12. The method of claim 11, wherein the nitride layer is a nitride of the second metal layer.

13. The method of claim 12, wherein the second metal layer and the nitride layer extends over an isolation region adjacent the first epitaxy semiconductor region to an adjacent first epitaxy region.

14. The method of claim 13, forming a contact plug, the contact plug contacting the nitride layer over the isolation region.

15. The method of claim 8, wherein a portion of the first epitaxy semiconductor region remains unreacted after forming the first metal silicide/germanide layer.

16. A method comprising:
   growing a first epitaxy semiconductor region at a major surface of a wafer, wherein the first epitaxy semiconductor region comprises an upward facing facet facing upwardly and a downward facing facet facing downwardly, and wherein the upward facing facet and the downward facing facet are neither parallel nor perpendicular to the major surface of the wafer;
   forming a second epitaxy semiconductor region on the upward facing facet and the downward facing facet;
   forming a first metal layer contacting the second epitaxy semiconductor region;
   performing a first annealing, wherein the first metal layer reacts with the second epitaxy semiconductor region to form a first metal silicide/germanide layer;
   forming a second metal layer contacting the second epitaxy semiconductor region on the downward facing facet, wherein the first metal layer and the second metal layer comprise different metals; and
   performing a second annealing, wherein the second metal layer reacts with the second epitaxy semiconductor region to form a second metal silicide/germanide layer.

17. The method of claim 16, wherein forming the second metal layer comprises:
   forming a first metal sub-layer over the upward facing facet and the downward facing facet; and
   forming a first metal nitride sub-layer over the first metal sub-layer.

18. The method of claim 16, further comprising removing unreacted portions of the first metal layer after performing the first annealing.

19. The method of claim 16, wherein a portion of the second epitaxy semiconductor region remains after the second annealing.

20. The method of claim 16, wherein after forming the first metal layer and prior to performing the first annealing, the downward facing facet is free of the first metal layer.

* * * * *